United States Patent
Yilmazoglu et al.

(10) Patent No.: US 12,127,490 B2
(45) Date of Patent: Oct. 22, 2024

(54) GUNN DIODE AND METHOD OF MANUFACTURING THE SAME

(71) Applicant: Technische Universität Darmstadt, Darmstadt (DE)

(72) Inventors: Oktay Yilmazoglu, Roßdorf (DE); Ahid S. Hajo, Darmstadt (DE)

(73) Assignee: Technische Universität Darmstadt, Darmstadt (DE)

( * ) Notice: Subject to any disclaimer, the term of this patent is extended or adjusted under 35 U.S.C. 154(b) by 362 days.

(21) Appl. No.: 17/762,775

(22) PCT Filed: Sep. 24, 2020

(86) PCT No.: PCT/EP2020/076715
§ 371 (c)(1),
(2) Date: Mar. 23, 2022

(87) PCT Pub. No.: WO2021/058645
PCT Pub. Date: Apr. 1, 2021

(65) Prior Publication Data
US 2022/0344587 A1    Oct. 27, 2022

(30) Foreign Application Priority Data
Sep. 25, 2019 (DE) .................. 10 2019 125 847.2

(51) Int. Cl.
*H10N 80/10* (2023.01)
*H10N 80/00* (2023.01)

(52) U.S. Cl.
CPC .......... *H10N 80/107* (2023.02); *H10N 80/01* (2023.02)

(58) Field of Classification Search
CPC .. H10N 80/107; H10N 80/01; H01L 33/0075; H01L 33/0062; H01L 29/2003; H01L 33/385
See application file for complete search history.

(56) References Cited

U.S. PATENT DOCUMENTS 3,691,481 A * 9/1972 Kataoka ................. H10N 80/10
257/E47.002
4,978,928 A * 12/1990 Ancona .................... H03B 9/12
257/E47.004
(Continued)

FOREIGN PATENT DOCUMENTS

CN       104681721 A  *  6/2015
CN       105206684 A     12/2015
(Continued)

*Primary Examiner* — S M Sohel Imtiaz
(74) *Attorney, Agent, or Firm* — Smartpat PLC

(57) ABSTRACT

A Gunn diode is disclosed which comprises a first contact layer, a second contact layer, and an active layer based on a gallium nitride (GaN) semiconductor material having a base surface and a side surface non-parallel thereto. Optionally, related materials such as aluminum indium gallium nitride (AlInGaN) materials may also be used as the active layer. The first contact layer electrically contacts the side surface to form a side contact. The second contact layer forms an electrical contact for the base surface, so that a maximum of the electric field strength is formed when an electric voltage is applied between the first contact layer and the second contact layer at the side contact.

15 Claims, 4 Drawing Sheets

(56) References Cited

U.S. PATENT DOCUMENTS

| | | | | |
|---|---|---|---|---|
| 5,250,815 A | * | 10/1993 | Battersby | H10N 80/107 |
| | | | | 257/498 |
| 2002/0117681 A1 | * | 8/2002 | Weeks | H01L 29/802 |
| | | | | 257/E29.022 |
| 2004/0130002 A1 | * | 7/2004 | Weeks | H01L 29/66204 |
| | | | | 257/E29.022 |
| 2006/0214842 A1 | * | 9/2006 | Takenoshita | H03D 9/0633 |
| | | | | 342/134 |
| 2018/0358412 A1 | * | 12/2018 | Park | H10N 80/107 |
| 2021/0328143 A1 | | 10/2021 | Yilmazoglu et al. | |

FOREIGN PATENT DOCUMENTS

| | | | |
|---|---|---|---|
| CN | 110350084 A | | 10/2019 |
| DE | 102018121672 A1 | | 3/2020 |
| EP | 0403365 A1 | | 12/1990 |
| FR | 2181466 A1 | * | 12/1973 |
| JP | 3923260 B2 | * | 5/2007 |

\* cited by examiner

GUNN DIODE AND METHOD OF MANUFACTURING THE SAME

The present invention relates to a Gunn diode and a method of manufacturing a Gunn diode and, more particularly, to a Gallium Nitride-based Gunn diode with high output powers in the high frequency range for active imaging scanners.

BACKGROUND

The Gunn effect has been successfully used in GaAs or InP-based semiconductor devices to generate high-frequency signals. These semiconductor materials exhibit material properties such as energy band responses, charge carrier velocities and mobilities that can initiate the electron transfer of the Gunn effect.

Gunn diodes use this effect by causing electrons to accumulate and travel through the diode in bursts (like waves) through suitable circuitry (e.g. by applying an appropriate supply voltage). This in turn results in the generation and subsequent radiation of electromagnetic waves corresponding to this frequency.

Especially for very high frequencies (e.g. in the terahertz range), known GaAs-based semiconductor devices have a number of disadvantages. These are due to the fact that saturation velocity for electrons as well as electron transfer times are too low for these high frequencies. Thus, these semiconductor devices are hardly applicable for frequencies in the terahertz range. Furthermore, the electrical threshold field strength for the so-called "electron transfer effect" or the energy band gap is too low for high output powers.

Gallium nitride-based Gunn diodes are advantageous because the thermally well-conductive substrate (GaN) can produce stable negative differential resistances. Optionally, related materials such as aluminum indium gallium nitride (AlInGaN) materials are also possible as active layers.

On the other hand, since there is a growing demand for THz radiation sources, it is desirable to find alternatives to GaAs-based semiconductor devices. In particular, it is desirable to make other materials efficiently usable for the generation of high frequency signals.

BRIEF DESCRIPTION OF THE INVENTION

At least a part of the above problems is isolved by a Gunn diode according to claim 1, a scanner according to claim 10, and a method of manufacturing the same according to claim 1. The dependent claims define further advantageous embodiments for the objects of the independent claims.

The present invention relates to a Gunn diode having a first contact layer and a second contact layer. The Gunn diode further comprises an active layer based on a gallium nitride (GaN) semiconductor material having a base surface and a non-parallel side surface. The first contact layer electrically contacts the side surface to form a side contact. The second contact layer forms an electrical contact for the base surface such that a maximum of the electric field strength is formed when an electric voltage is applied between the first contact layer and the second contact layer at the side contact.

In conventional GaAs switches, the electrons in the conduction band are generated from the valence band or so-called "deep levels" between the valence and conduction bands. In contrast, the gallium nitride GaN diodes according to embodiments transfer electrons from the main valley in the conduction band to a satellite valley, which is again in the conduction band. Due to the use of GaN materials, the electron masses in the satellite valley are very high and cause a significant increase in resistance. This leads to a fast current decay. Moreover, this transfer can occur in a very short time (e.g., below picoseconds) and therefore leads to rapid current changes. Therefore, high power THz radiation can be generated.

The side contact has the effect that the field strength at the side contact is greater than in other areas, for example. Therefore, the Gunn effect is mainly effective in the side region above a certain depth, i.e. where the field strength is sufficient for electron transfer. A parasitic current that does not contribute to the Gunn effect and flows through the active layer in an inner region, within the contour of the side region, does not further disturb this Gunn effect.

Optionally, Gunn diode comprises a substrate formed between the second contact layer and the ground plane, and in particular comprises gallium nitride.

Optionally, Gunn diode comprises a substrate formed between the second contact layer and the ground plane and having silicon carbide (SiC), silicon or sapphire.

Optionally, the active layer comprises an electrically conductive region along a front surface opposite the base surface, which is formed in particular by a highly doped region (significantly more highly doped than the rest of the layer).

Optionally, the side surface is beveled or perpendicular to the base surface and connects the base surface to the front surface.

Optionally, the Gunn diode comprises at least one of the following passivations: an intermediate passivation between the front surface and the first contact layer; a substrate passivation formed laterally adjacent to the active layer between the first contact layer and the substrate.

Optionally, the first contact layer contacts (electrically) the active layer along the side surface only.

Optionally, the Gunn diode includes an optical window as optical access to the front surface to enable or support optical excitation in the side contact area.

Optionally, the side contact is formed as a resistive side contact or as a Schottky side contact. A resistive contact is defined here by a transition region between metal and semiconductor that behaves like an ohmic resistor. In contrast to a Schottky contact, it has, for example, no or only a negligible rectifier function.

Accordingly, a Schottky contact refers to a metal-semiconductor junction that has a rectifying effect and therefore behaves like a diode. As a rule, the Schottky contact is a sharp, abrupt transition, whereas in a resistive contact there is a certain amount of material mixing (e.g. due to thermal treatment).

Optionally, at least one of the defined layers has one of the following extents:
- the active layer has a thickness in the range of up to 0.55 μm,
- the conductive area has a thickness in the range of 10-200 nm,
- the substrate has a thickness in the range between and 10400 μm.

Optionally, the first contact layer and/or the second contact layer is formed by a layer sequence with at least one of the following materials: titanium, aluminum, gold. However, they can also be formed by highly doped semiconductor material.

Embodiments also relate to an imaging scanner using a previously defined Gunn diode as the THz radiation source.

Embodiments also relate to a method of manufacturing a Gunn diode. The method comprises the following steps:

Providing a second contact layer;

Forming an active layer based on a gallium nitride (GaN) semiconductor material having a base surface and a side surface non-parallel thereto, wherein the second contact layer forms an electrical contact for the base surface (optionally, related materials such as aluminum indium gallium nitride (AlInGaN) materials are also possible as active layer);

forming a side electrical contact between the side surface and a first contact layer such that a maximum of the electric field strength forms upon application of an electric voltage between the first contact layer and the second contact layer at the side contact.

Optionally, the method further comprises:

forming the second contact layer on a substrate, wherein forming an active layer is performed on a surface of the substrate that is opposite to the second contact layer;

Formation of an intermediate passivation on the active layer;

forming a first contact layer on the intermediate passivation and at least partially on the substrate laterally adjacent to the active layer, optionally forming a substrate passivation between the first contact layer and the substrate laterally adjacent to the active layer.

Optionally, the method further comprises: exposing at least a portion of the first contact layer opposite the active layer to provide an optical window for optical irradiation to support the Gunn diode.

Optionally, the method further comprises: providing a light guide for optical delivery of photons into the active layer in a vicinity of the side contact.

Advantages of embodiments can be summarized as follows:

Side contacting according to embodiments increases stability and also enables generation of broadband THz radiation (in the range between 50 GHz to several THz, e.g., up to 5 THz or 10 THz or even more).

The nitride materials allow operation at much higher frequencies and powers because, among other things, the achievable saturation velocities for electrons are very high (for gallium nitride they are at least two times higher than for gallium arsenide), electric threshold field strengths for the so-called electron transfer effect are much higher (for the gallium nitride used this is 50 times higher than for gallium arsenide), and there is a large energy band gap.

Thus, these devices can also be used as short-wavelength optical diodes and semiconductor lasers, which are used in fields such as communications, lighting, multimedia, etc. find application.

While signal sources based on gallium arsenide and InP devices each have cutoff frequencies of 100 GHz and 200 GHz (for the fundamental mode), respectively, the calculated limits for gallium nitride diodes are above 700 GHz. Calculations for this were performed for gallium nitride-based Gunn diodes.

Photomodulated field emission currents from GaN field emitter peaks were achieved at low frequencies.

Furthermore, according to embodiment examples, the new gallium nitride tunnel diode has the advantage over gallium arsenide switches that the much larger current changes can be switched stably and quickly. Since the output power is proportional to the square of the current change ($P \simeq \Delta I^2$), the desired high output powers can be achieved.

BRIEF DESCRIPTION OF THE FIGURES

The embodiments of the present invention will be better understood with reference to the following detailed description and accompanying drawings of the various embodiments, which, however, should not be construed as limiting the disclosure to the specific embodiments, but are for explanation and understanding only.

DETAILED DESCRIPTION

Figure 1:
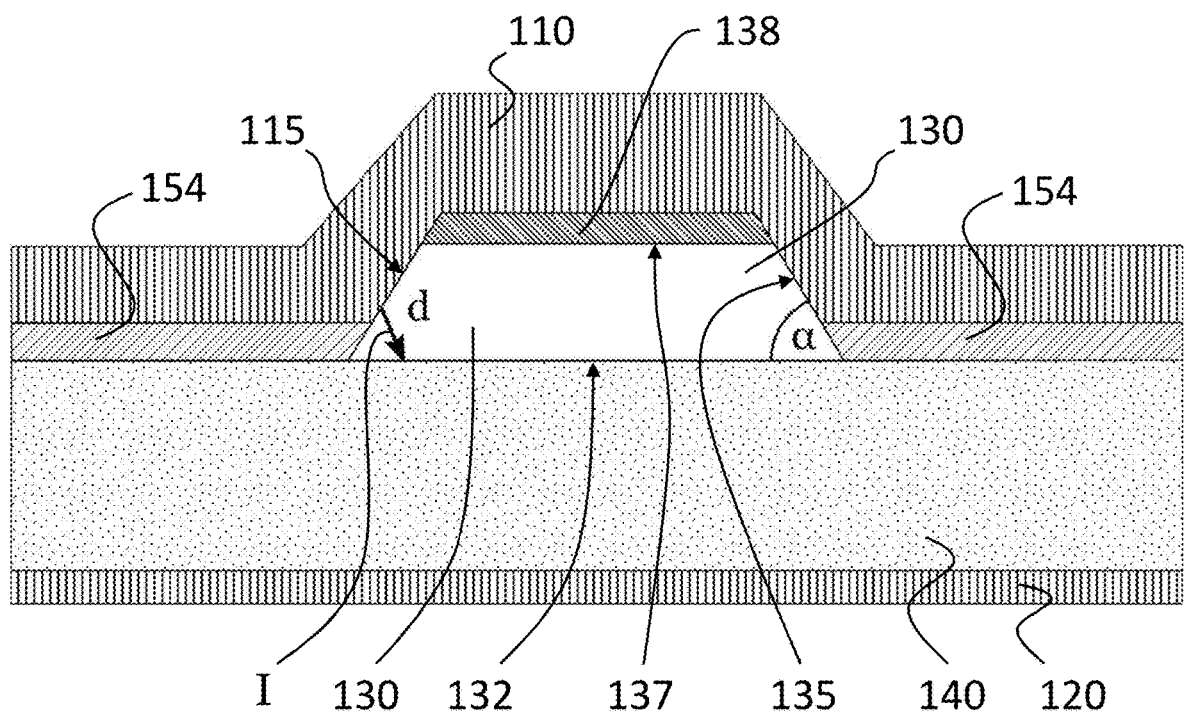
FIG. 1 shows a cross-section through a Gunn diode according to an embodiment of the present invention.

FIG. 1 shows an example embodiment of the Gunn diode. The Gunn diode includes an active layer 130 formed between a first contact layer 110 and a substrate 140, which is contacted on a back surface by the second contact layer 120. The active layer 130 is disposed on the substrate 140 with a base surface 132, and opposite the base surface 132, the active layer 130 forms a front surface 137. The front surface 137 and the base surface 132 are connected by the side surface 135.

The side surface 135 may extend completely around the active layer 130, with the first contact layer 110 electrically contacting the side surface 135 to form the side contact 115.

Along the front surface 137, the active layer 130 includes a conductive region 138 that may be formed, for example, by a highly doped region of the active layer 130, wherein the doping may be selected to adjust a desired conductivity. The purpose is to facilitate electrical contacting.

In the embodiment example shown in FIG. 1, a substrate passivation 5 14 is formed on the substrate 140 laterally offset from the active layer 130 to provide electrical insulation between the first contact layer 110 and the substrate 140. In the illustrated embodiment, the side surface 135 is formed inclined to the base surface 132. For example, the side surface 135 may have an angle α relative to the base surface 132 in a range between 30° and 90°. However, the angle between the side surface 135 and the base surface 132 can be any angle, for example ≤90° or in a range between 40° and 90°, or approximately at 60°.

The first contact layer 110 may be fully formed on the conductive region 138. However, it is also possible for the first contact layer 110 to continue to extend horizontally laterally adjacent the active layer 130. Importantly, the first contact layer 110 forms the side contact 115 along the side surface 135.

The THz signal is generated in the active layer 130 over a depth d, and predominantly in the region of the side contact 115, since there—when a voltage is applied between the first and second contact layers 110, 120—the distance to the substrate 140 is the smallest (the shortest current path "d" is smaller than the layer thickness of the active layer 130) and thus the generated field strength is the greatest. As a result, the current flow I that generates the AC signal is also reached there sooner (at smaller operating voltages) than in other regions. This enables the generation of THz waves with high powers ($P \simeq \Delta I^2$). The generated THz signal can be tapped by the Gunn diode between the first contact layer 110 and the second contact layer 120.

In the embodiment example of FIG. 1, parasitic currents, which do not contribute appreciably to the Gunn effect, are still possible between the conductive region 138 and the substrate 140.

Figure 2A:
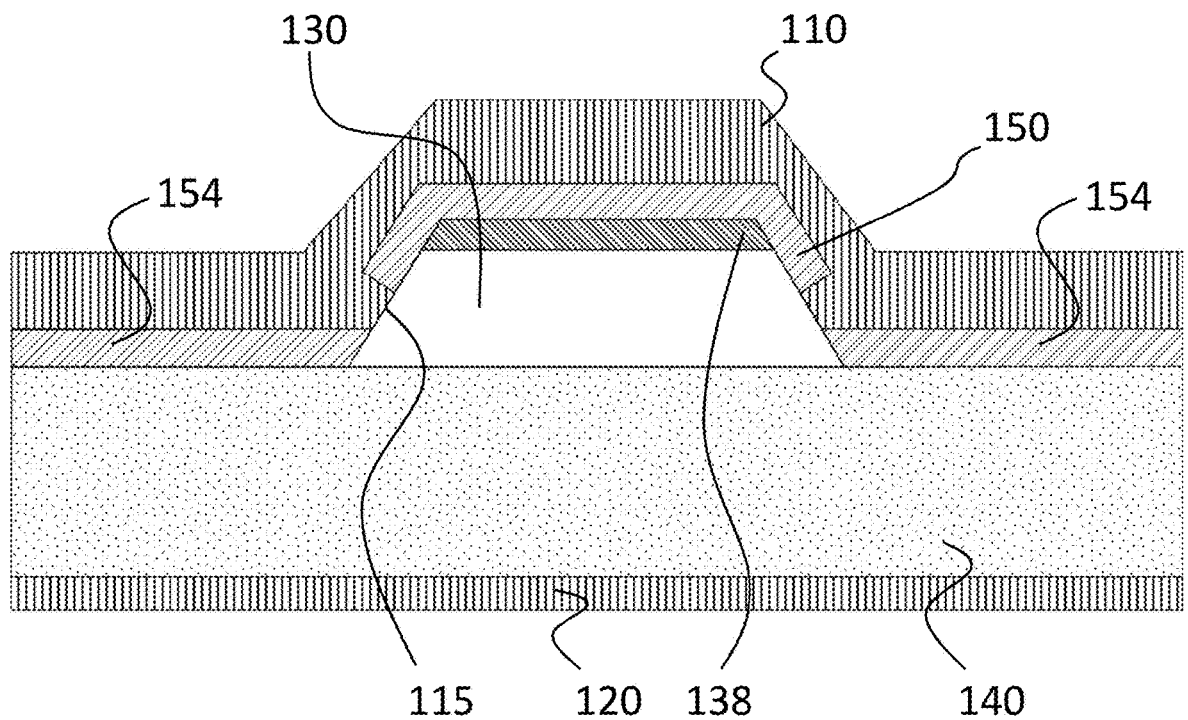
FIGS. 2A, 2B show a Gunn diode according to a further embodiment in a cross-sectional view and a top view.

FIG. 2A shows a Gunn diode according to a further embodiment in which possible parasitic currents between the first contact layer 110 and the active layer 130 are minimized by an intermediate passivation 150.

For this purpose, an intermediate passivation 150 is formed 138 between the first contact layer 110 and the conductive region. The intermediate passivation 150 can also extend laterally to a certain extent along the side surface 135 and leave only the area of the side contact 115 free. In that case, electrical contacting of the active layer 130 is only effected there. Thus, in the embodiment example of FIG. 2, an electric current is generated only where it is relevant for the Gunn effect.

Figure 2B:
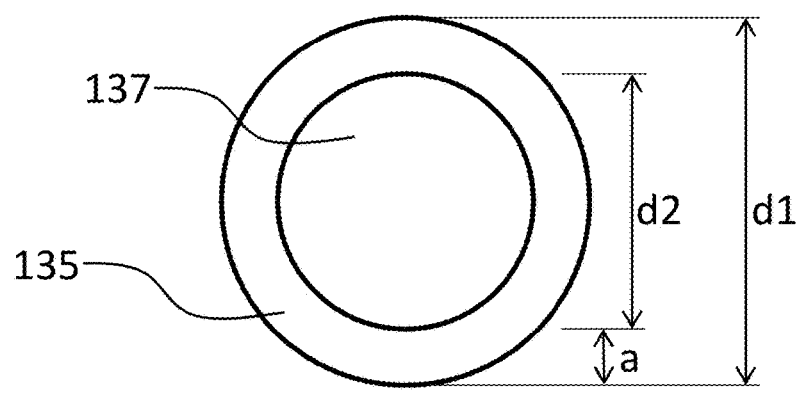

FIG. 2B shows a top view of the generated Gunn diode. The active layer 130 comprises, by way of example, a circular shape having a base diameter d1 along the base surface and a front diameter d2 along the front surface 137. The intermediate region is formed by the side surface 135, the extent relative to d1, d2 being given by the angle α and hence the thickness a. In this partial region of the side surface 135, the THz signal is generated as a result of the Gunn effect.

The Gunn diode is given here only by way of example in circular form. The invention is not intended to be limited to this. Any other shape is also possible.

Likewise, the inner area with the diameter d2 can be selected as small as desired. Thus very small Gunn diodes of high power or power density are producible.

Figure 3:
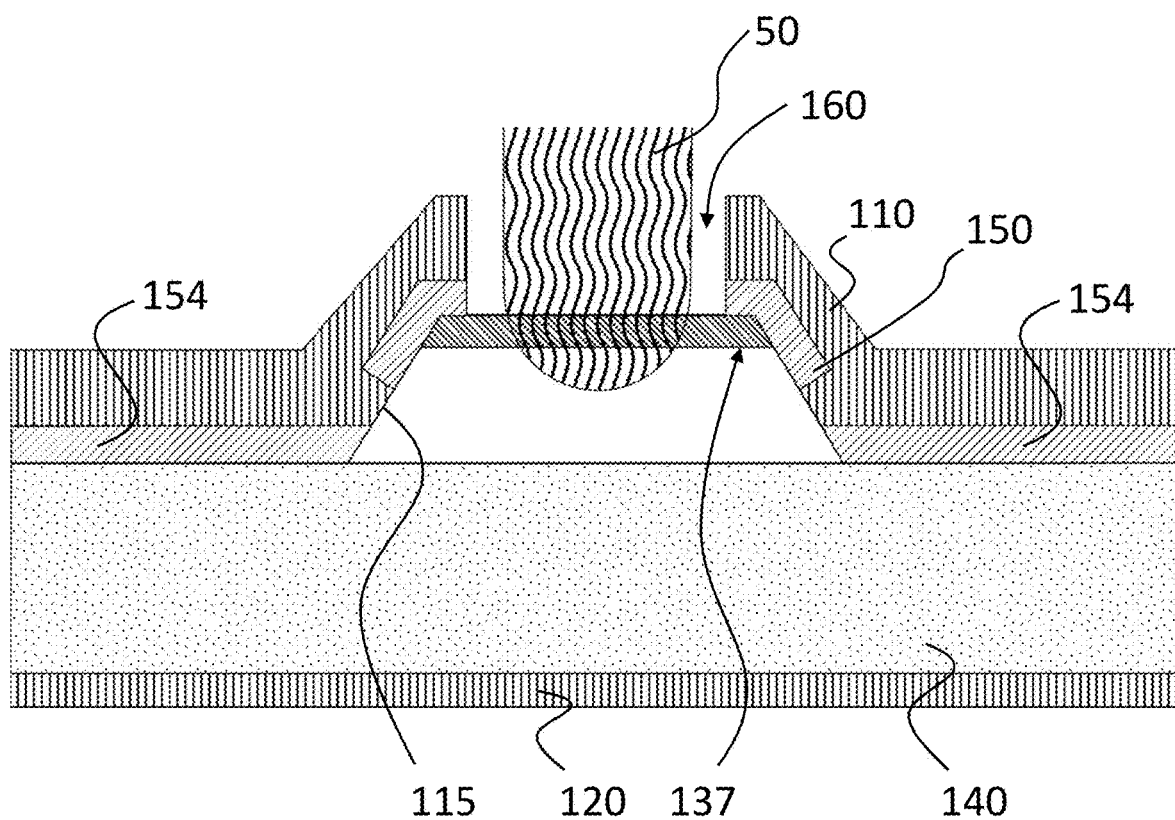
FIG. 3 shows a Gunn diode according to a further embodiment.

FIG. 3 shows another embodiment example for the Gunn diode, wherein in this embodiment example an optical window 160 is formed above the front surface 137. For this purpose, the first contact layer 110 above the front surface 137 (within the side surface 135) can be opened completely or partially, as an example. The resulting optical window 160 may be used for laser irradiation 50. The laser irradiation 50 may be applied over the entire surface or may be targeted only in the side area 135 where the Gunn effect acts.

The optional optical excitation by photons can be provided by a pulsed or unpulsed laser and supports the Gunn effect (i.e. electron transfer between the valleys/bands). For example, the laser used may be an infrared laser that has a penetration depth greater than 2 μm. However, the invention is not intended to be limited to any particular laser. Any other laser that can produce sufficient power or optical photons with a desired energy to support the Gunn effect (i.e., the photon energy can be adjusted depending on the specific energy band gaps between the valleys used) can be used.

Figure 4:
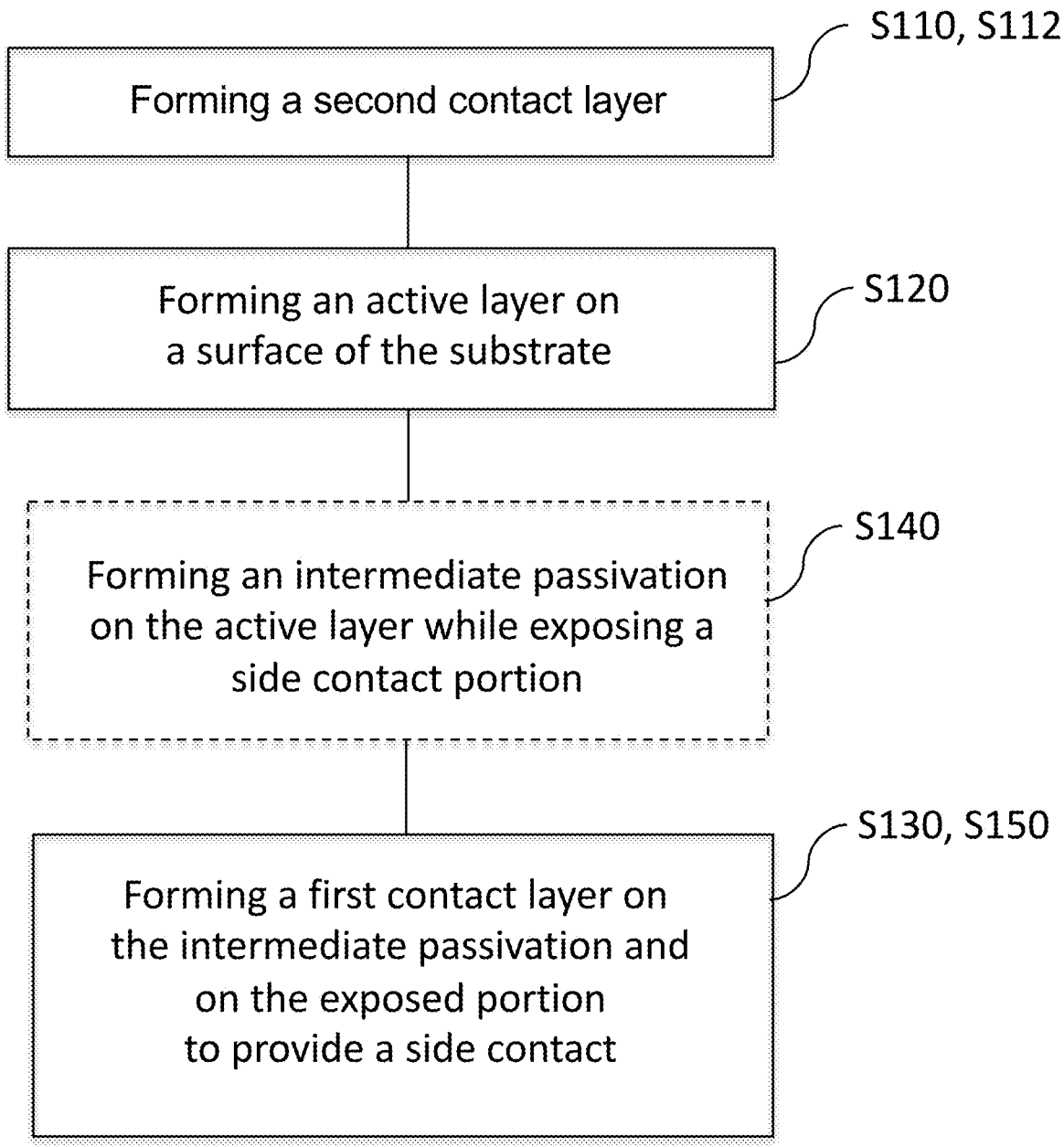
FIG. 4 shows a flowchart for a process for manufacturing said Gunn diodes.

FIG. 4 shows a flowchart for a method of manufacturing a Gunn diode according to an embodiment. The method comprises the steps (optional steps are shown dashed):

Forming S112 (and thus providing S110) the second contact layer 120 on a substrate 140;

Forming S120 an active layer 130 on a surface of the substrate 140 that is opposite to the second contact layer 120, wherein the second contact layer 120 forms an electrical contact for a base surface of the active layer 130;

Forming S140 an intermediate passivation 150 on the active layer 130, leaving a side contact region 115 exposed, Forming S130, S150 a first contact layer 110 on the intermediate passivation 150 and the exposed region to form a side contact 115 such that a maximum of the electric field strength is formed when an electric voltage is applied between the first contact layer 110 and the second contact layer 120 at the side contact 115.

Further, the method may include forming a substrate passivation layer (154) formed laterally adjacent to the active layer (130) between the first contact layer (110) and the substrate (140) (for example, where the contact layer (110) passes over the ground plane 132 and may cause a short circuit).

All other structures described above can be part of this manufacturing process through further optional process steps.

According to embodiments, the contact between the first contact layer 110 and the active layer 130 may be, by way of example, a resistive contact or a Schottky contact. In the ohmic contact, the junction between the first contact layer 110 and the semiconductor material of the active layer 130 (e.g., a gallium nitride-based material) is fuzzy, whereas in a Schottky contact, a sharp interface is created between the metallization and the semiconductor material. The physical difference between the two contacts is that the Schottky contact exhibits a rectifying effect (similar to a diode) and the ohmic contact behaves like an ohmic resistance.

For example, the first contact layer 110 and/or the second contact layer can be created by a Ti:Al:Ti:Au layer sequence. However, any other metallization can be used to create the electrical contact. The second contact layer 120 may also be formed by a highly doped region of the substrate 140. For example, the substrate 140 may be a gallium nitride substrate, such that the second contact layer 120 may be formed by simply backside doping with a desired doping profile. Exemplarily, the second contact layer 120 may have a thickness of up to 100 nm. For example, the highly doped regions of the conductive region 138 and/or the second contact layer 120 may be generated in a doping of up to 10 $cm^{318-}$ or more.

The passivation(s) 150, 154 can be produced, for example, by a plasma deposition (e.g., PECVD) or other means that ensures reliable electrical insulation. Optionally, an insulating diamond passivation with good thermal conductivity can also be used.

According to further embodiments, it is also possible to perform the laser irradiation 50 from below or from a side. For example, electrical contacts 110, 120 can be made through transparent material so that laser irradiation 50 can be performed through the contact layers 110, 120. Similarly, the passivation(s) 154, 150 can be transparent so that the passivation(s) can also be used to direct the laser irradiation towards or through the Gunn diode region.

The substrate 140 can have a thickness of 300 μm, for example. The active layer 130 can have a thickness of 2.5 μm, for example, or it can be significantly thinner.

According to further embodiments, the first contact layer 110 and the second contact layer 120 are connected to an integrated broadband antenna that is fed with broadband THz radiation, whether with or without pulsed laser irradiation. Thus, a variety of imaging and spectroscopic applications (e.g., scanners) in THz frequency range are enabled. In particular, THz frequencies become producible in output powers much higher than would be possible for conventional gallium arsenide-based Gunn diodes or for the InP Gunn diodes. Optionally, an integrated narrowband antenna is also possible to generate monochromatic THz radiation with or without pulsed laser irradiation.

Unlike conventional GaN-based transistors, the side contacts 115 according to embodiments do not serve as gate contacts for modulating the main channel (main current path) between the cathode and anode. Rather, the side contacts 115 may serve as the first main electrode (cathode) and the second, lower contact layer 120 may serve as the second main electrode (anode). According to embodiments, the main channel (see FIG. 2 and FIG. 3) is thus not formed between two opposite sides, but between the side contact 115 and the second contact layer 120. With the intermediate passivation 150 between the front surface 137 and the first contact layer 110, it is achieved that the first contact layer 110 electrically contacts the active layer 130 only along the side surface 135. The main current path connects the side contacts 115 to the second contact layer 140, passing through the exemplary substrate 140.

An advantage of side contacting is the so-called negative differential resistance, the generation of which is facilitated, thereby supporting the Gunn effect. In addition, embodiments do not have the contacting problems present in conventional Gunn diodes because a large contact is used on the side of the diode. This allows for a stable contact. In addition, small diodes can be created, allowing for a better heat sink and thus increased stability of the Gunn diode. Finally, very simple laser irradiation 50 is possible using the side contact 115, since the laser can irradiate the diode from above (e.g., through the optical window 160).

Embodiments allow very small diodes (because of the very small effective thickness of the diodes), which is difficult to achieve with conventional diodes with a stable contact. For example, instead of the standard 2.5 μm thick diode, a much smaller diode thickness can be realized. Side contacting also results in a smaller effective diode cross-section proportional to a, and a smaller effective diode thickness d (see FIG. 2). Therefore, the highest electric field strength in the current channel is only present at the edges.

With this approach, stable diodes can be produced according to embodiment examples, in which not the entire diode cross-section is used, but only the side region 135. By using the small area, stability is also improved. The diode is effectively thinnest at the side contact 115, so the Gunn effect occurs in this side channel even at small voltages (compared to other areas). In the longer areas, the voltage only causes a parasitic current flow, which is not important for the Gunn effect any further.

Alternatively, it is also possible to passivate the diode area, as shown in the embodiment example of FIG. 2A. In this case, the parasitic currents are reduced. Another possibility according to further embodiments is to use an additional, optional laser irradiation 50, as shown 3 in figure. In this case, the laser is used to facilitate the Gunn effect.

The features of the invention disclosed in the description, the claims and the figures may be essential to the realization of the invention either individually or in any combination.

LIST OF REFERENCE SIGNS

50 Laser irradiation
110 first (upper) contact layer
115 Side contact
120 second (lower) contact layer
130 active layer (GaN)
132 Footprint
135 Side face
137 Front surface
138 conductive area
140 Substrate
150 Intermediate passivation
154 Substrate passivation
160 optical window

The invention claimed is:

1. A Gunn diode, comprising:
a first contact layer and a second contact layer;
an active layer based on a semiconductor material with gallium nitride or aluminum indium gallium nitride (AlInGaN) having a base surface, a front surface opposite the base surface, and a side surface non-parallel thereto, wherein the second contact layer forms an electrical contact for the base surface; and
an intermediate passivation between the front surface and the first contact layer,
wherein the first contact layer electrically contacts the side surface to form a side contact,
wherein an electric field forms upon application of an electric voltage between the first contact layer and the second contact layer, and
wherein the electric field has a maximum electric field strength at the side contact.

2. The Gunn diode according to claim 1, further comprising:
a substrate formed between the second contact layer and the base surface and comprising, in particular, gallium nitride.

3. The Gunn diode according to claim 2,
wherein the active layer includes an electrically conductive region along the front surface opposite the base surface, which is formed in particular by a more highly doped region.

4. The Gunn diode according to claim 3,
wherein the side surface is beveled or perpendicular to the base surface and connects the base surface to the front surface.

5. The Gunn diode according to claim 4, wherein the intermediate passivation is a substrate passivation formed laterally adjacent to the active layer between the first contact layer and the substrate.

6. The Gunn diode according to claim 1,
wherein the first contact layer electrically contacts the active layer only along the side surface.

7. The Gunn diode according to claim 3,
wherein an optical window is formed as optical access to the front surface to enable or support optical excitations in the region of the side contact.

8. The Gunn diode according to claim 1,
wherein the side contact is formed as a resistive side contact or as a Schottky side contact.

9. The Gunn diode according to claim 3, wherein at least one of the following extensions applies:
the active layer has a thickness in the range from 0.5 to 5 μm,
the conductive region has a thickness in the range of 10-200 nm,
the substrate has a thickness in the range between 10 and 400 μm.

10. The Gunn diode according to claim 1,
wherein the first contact layer and/or the second contact layer is formed by a layer sequence comprising at least one of the following materials: titanium, aluminum, gold, or is formed as a highly doped semiconductor material.

11. An imaging scanner comprising the Gunn diode according to claim 1 as a THz radiation source.

12. A method of manufacturing a Gunn diode, comprising the following steps:
providing a second contact layer;
forming an active layer based on a gallium nitride (GaN) semiconductor material having a base surface, a front surface opposite the base surface, and a non-parallel side surface, wherein the second contact layer forms an electrical contact for the base surface;

forming an intermediate passivation and forming a first contact layer, wherein the intermediate passivation is formed between the front surface and the first contact layer; and forming an electrical side contact between the side surface and the first contact layer, wherein an electrical field forms upon application of an electrical voltage between the first contact layer and the second contact layer, wherein the electric field has a maximum electric field strength at the side contact.

13. The method according to claim 12, further comprising the steps:

forming the second contact layer on a substrate, wherein forming the active layer is performed on a surface of the substrate that is opposite to the second contact layer.

14. The method according to claim 12, further comprising:

exposing at least a portion of the first contact layer opposite the active layer to provide an optical window for optical irradiation to support the Gunn diode.

15. The method according to claim 12, further comprising:

providing a light guide for optical delivery of photons into the active layer in a vicinity of the side contact.

* * * * *